United States Patent [19]

Hollingsworth et al.

[11] Patent Number: 4,937,075

[45] Date of Patent: Jun. 26, 1990

[54] METHOD OF MAKING SEMICONDUCTOR CHIP HAVING FIELD EFFECT TRANSISTORS WHICH HAVE DIFFERING THRESHOLD VOLTAGES DETERMINED IN A SINGLE MASKING STEP

[75] Inventors: Richard J. Hollingsworth, Concord; Donald E. Nelsen, Winchester, both of Mass.

[73] Assignee: Digital Equipment Corporation, Maynard, Mass.

[21] Appl. No.: 343,689

[22] Filed: Apr. 27, 1989

[51] Int. Cl.⁵ .......................................... H01L 21/336
[52] U.S. Cl. ........................................ 437/45; 437/41; 437/51; 437/56
[58] Field of Search ...................... 437/29, 40, 41, 45, 437/51, 56, 57, 59; 357/23.12, 83; 307/303, 303.1, 303.2

[56] References Cited

U.S. PATENT DOCUMENTS 3,867,196  2/1975  Richman ............................... 437/45
4,166,223  8/1979  Bluzer ................................ 357/231.2
4,845,390  11/1984  Jones et al. ......................... 357/23.12

Primary Examiner—Brian E. Hearn
Assistant Examiner—T. Thomas
Attorney, Agent, or Firm—Kenyon & Kenyon

[57] ABSTRACT

A chip having field effect transistors which have differing threshold voltages determined in a single masking step and a method of making the chip provides a chip usable at both cryogenic and room temperatures without a costly additionaly masking step. The chip has devices with low threshold voltages that are therefore optimized for performance at low temperatures, and devices with high threshold voltages that are optimized for performance at higher temperatures. Such high threshold voltage devices are also usable, though suboptimally, at lower temeperatures such as cryogenic temperatures. The two sets of devices have their threshold voltages determined in a single masking step, with the higher threshold voltage values being provided during this step by reducing the width of a device to produce a parasitic effect.

8 Claims, 3 Drawing Sheets

METHOD OF MAKING SEMICONDUCTOR CHIP HAVING FIELD EFFECT TRANSISTORS WHICH HAVE DIFFERING THRESHOLD VOLTAGES DETERMINED IN A SINGLE MASKING STEP

FIELD OF THE INVENTION

The invention is directed to the field of MOS transistors and, in particular, to a new MOS transistor implementation having transistors with separate threshold values that can be manufactured without additional masking steps typically required to provide multiple sets of MOS transistors having different threshold voltages.

BACKGROUND OF THE INVENTION

Recently there has been a rapid increase in research relating to cryogenic operation of electrical and electronic devices, equipment and systems to realize certain performance advantages inherent at cryogenic temperatures, e.g. 77° K. and lower. In certain applications there is need for these electronic devices to respond to temperatures above cryogenic temperatures in case of problems with the maintaining of cryogenic temperatures. A circuit containing MOS devices which are optimized to operate at cryogenic temperatures will suffer degraded operation and then will cease proper functioning altogether as the temperature is elevated toward room temperature.

It is well known in MOS technology that the magnitude of the threshold voltage for both n and p channel MOS transistors is a function of temperature. More specifically, the threshold voltage value of an MOS transistor increases in magnitude as the temperature is lowered. Accordingly, if a particular chip having transistors with a single particular threshold voltage value characteristic is to be operated throughout a wide temperature range, i.e., a temperature range from room temperature to a cryogenic temperature, the threshold voltage excursion due to temperature may be so great as to adversely effect the operating performance of the device at one end or the other of the temperature range.

If a particular MOS transistor is designed to have a threshold voltage which is optimized for cryogenic operation, the MOS transistor will not be able to function properly at room temperature because the rise in temperature will lower the threshold voltage to such an extent that it would not be possible to fully turn it off. Indeed, the overall maximum current at room temperature operation in a chip comprising MOS transistors which are optimized for cryogenic operation could be sufficiently high to destroy the chip circuitry.

On the other hand, if a particular MOS transistor is designed to have a threshold voltage which is optimized for room temperature operation, that transistor's threshold voltage will be set to a higher value than the cryogenic-optimized device above. Accordingly, as temperature is lowered to the cryogenic range from room temperature, the threshold voltage will increase to such an extent that it occupies an undesirably large portion of the device's switching range. This causes a lower drive than would have occurred with a lower threshold voltage transistor. Nevertheless, this higher-threshold transistor, when used in the appropriate logic circuit, will have performed logic functions reliably over the entire temperature range (even though the speed of operation would have been degraded at cryogenic temperatures relative to the cryogenic device.)

It is generally known in the prior art that more than one value for the threshold voltage of a particular n or p channel device type on a chip can be realized by utilizing an additional masked implant of charge for each additional threshold value desired, so that devices having different threshold voltages are produced on the same chip. However, an additional masking step reduces chip yield and thereby increases the manufacturing costs for a multiple threshold value device. Thus, the already known additional masking step process does not provide an acceptable means for providing a chip having MOS transistors with different threshold voltages so that the chip will have viable operation over a wide temperature range.

SUMMARY OF THE INVENTION

The present invention is applied to a semiconductor integrated circuit process that produces MOS transistors. In this type of process, the well known method of patterning successive layers of the circuit on a silicon wafer is used. A pattern on a mask is transferred to a photosensitive resist layer on a wafer by a photographic exposure process. After development and removal of soluable parts of the photoresist film, a hardened resist pattern remains on the surface of the wafer. Openings on this pattern permit either removal of material by etching processes, or addition of substances by implantation or chemical deposition. By performing a sequence of patterning steps such as this, a multilayered integrated circuit that has desired electrical characteristics is obtained. The present invention is a means of eliminating one of these mask steps.

According to the prior art, in order to achieve a chip containing MOS transistors with a second value of threshold voltage, an additional masking step is needed. The present invention eliminates this additional masking step by providing a method to produce a chip having separate MOS transistors having at least two different threshold voltage value characteristics without the utilization of additional masking steps beyond those required to manufacture a single transistor. The invention generally utilizes the "parasitic" effect whereby the reduction of the width of a transistor to its narrowest extreme causes a threshold voltage value of the transistor to increase. The parasitic effect is ordinarily avoided inasmuch as a narrow-width, parasitic, higher threshold voltage transistor will have a low performance capability. Indeed, those skilled in the art ordinarily seek a width somewhat wider than the width at which the parasitic effect occurs, to obtain as high a speed of performance as possible within the general, overall parameters of miniaturization desired in chip manufacturing.

In accordance with the invention, in addition to the low threshold voltage MOS transistors, a plurality of parasitic, high threshold voltage MOS transistors are arranged in a parallel configuration by providing a plurality of strips configured in a drain/gate/source/gate/drain/gate . . . source/gate/drain array. In this array, each source is part of two transistors and each drain, with the exception of the left and right end drains, is also a part of two transistors. The width of each drain, for example, is formed to the extreme, narrow parasitic width to provide a relatively high threshold voltage which decreases when the temperature of operation is raised to room temperature, a level that is suitable for viable operation of the high threshold voltage MOS transistors in the array. Moreover, the parallel configuration described above provides an effectively large width for the composite device with an effective drain current drive capability being approximately equal to the sum of the widths of all the parallel arranged narrow individual devices.

This invention provides means whereby MOS transistors can be modified to obtain a subset of transistors on the same chip with higher threshold voltages, which when connected into logic circuits will then function all the way up to room temperature from cryogenic temperature. Although this subset of transistors will not be as fast at the cryogenic temperature as transistors optimized for cryogenic temperature operation, this subset of transistors has the property that they will maintain functional operation and proper noise margins over the entire temperature range between cryogenic temperatures and room temperature.

DETAILED DESCRIPTION

Figure 1:
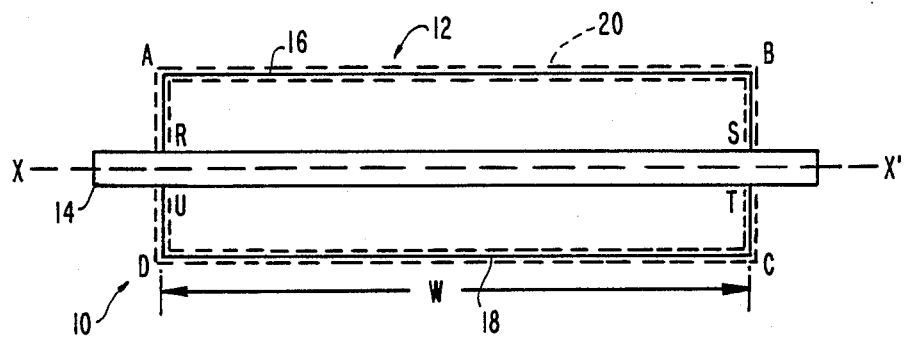
FIG. 1 is a top view of a prior art device.

FIG. 1 shows a top view of a typical MOS device 10, which can be either NMOS or PMOS, for example. The device has a diffusion mask 12 shown by rectangle ABCD. A gate 14 of the device is on top of the diffusion mask 12 and made of polysilicon or a conducting film, for example. The diffusion mask 12 is divided by the gate structure into two regions 16 and 18, defined respectively by rectangles ABSR and CDUT. Depending on how the device 10 is connected to a circuit, one diffusion region will serve as a source, and the other as a drain. The width W of the device 10 is shown in FIG. 1 and is defined as the width of the diffusion mask 12.

Figure 2:
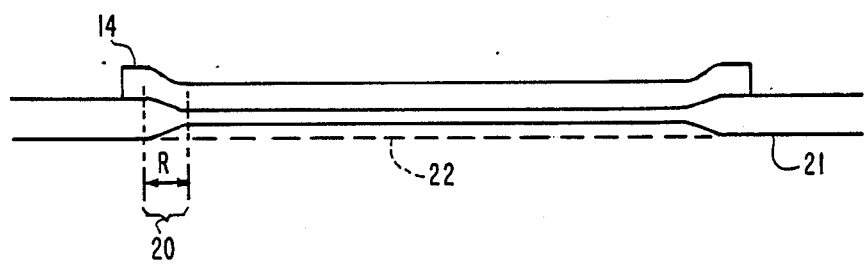
FIG. 2 is a cross-sectional side view of the device of FIG. 1 along the plane X—X[1] in FIG. 1.

A cross-section of FIG. 1 along the plane X—X' is depicted in FIG. 2. The device 10 shown in FIG. 2 is made by a LOCOS process, which is itself well known. The LOCOS process produces a so-called bird's beak region 20 in the oxide layer around the periphery of rectangle ABCD and the intersection of the birds-beak region 20 with the plane X—X', as is shown in FIG. 2, and illustrated in more detail in FIG. 3. When the device 10 is turned on, a conduction channel 22 is formed and the conduction direction is into or out of the page when looking at FIG. 2.

Figure 3:
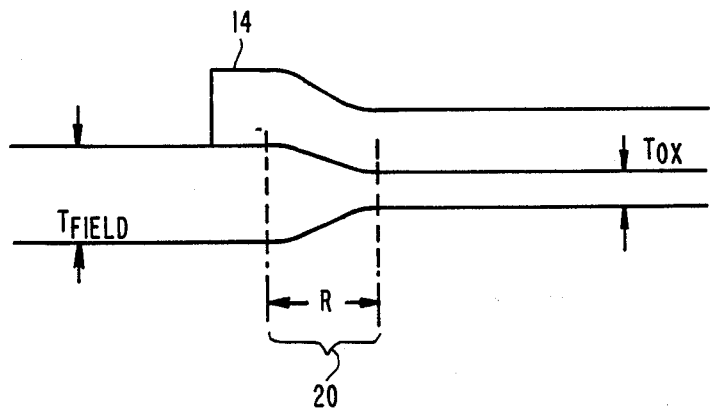
FIG. 3 is an enlarged view of a portion of FIG. 2.

The bird's beak region 20 (hereinafter transition region 20) is shown in FIG. 3 as an enlarged partial view of FIG. 2. The length of the transition region 20, denoted by R, is measured approximately from the point where the oxide thickness of the oxide layer 21 increases from a thin thickness ($t_{ox}$), to a thicker value ($t_{field}$). As stated earlier, this transition region 20 is formed by the known LOCOS process.

Figure 4:
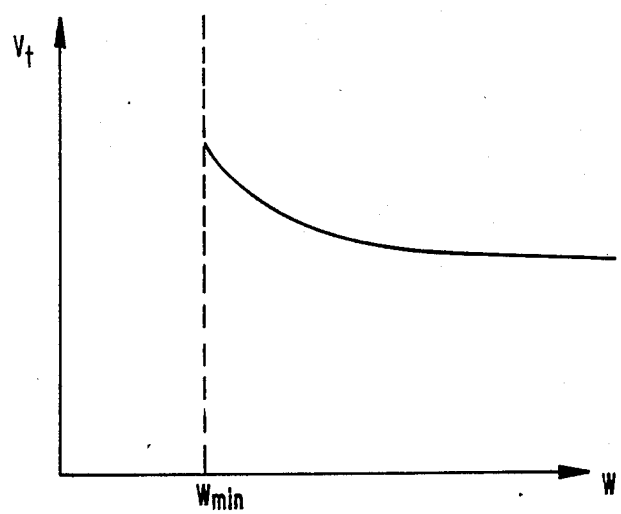
FIG. 4 illustrates the relationship between threshold voltage and device width.

The threshold voltage $V_t$ of the device 10 is dependent on the width W of the device 10. The relationship of the width W to threshold voltage $V_t$ is shown in FIG. 4. As is graphically illustrated by this Figure, although the threshold voltage $V_t$ remains constant for larger values of W, there is a sharp increase in $V_t$ when the minimum width ($W_{min}$) is approached. This minimum width $W_{min}$ is determined by process parameters that affect the length of the transition region, R, defined above. The lower value of $V_t$ occurs when W is significantly larger than the length R of the transition region 20, while the higher value of $V_t$ occurs near $W_{min}$, when R is a significant portion of W. The increase in the voltage threshold $V_t$ as the width W of the MOS device 10 approaches its narrowest extreme $W_{min}$ is known as the "parasitic width" effect.

Ordinarily, devices with a parasitically increased threshold voltage $V_t$ are avoided because of their lower performance due to their narrower channels. Devices with much wider channels are usually employed to obtain higher speed performance. In the prior art, if both a device with a low voltage threshold $V_t$ low and a device with a high voltage threshold $V_t$ high were desired on the same chip, an additional masking step was used. The present invention takes advantage of the parasitic effect to provide devices having different voltage thresholds $V_t$ high, $V_t$ low on the same chip, but without the additional masking step needed in the prior art.

Figure 5:
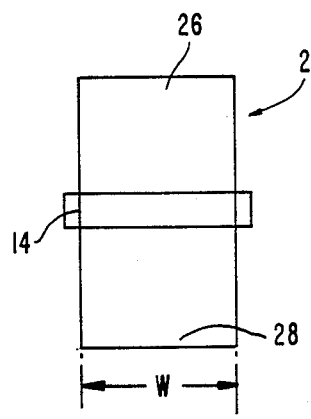
FIG. 5 shows a device made according to an embodiment of the present invention.

The present invention provides on the same chip devices 10 like that shown in FIG. 1 with a large W, and devices 24 shown in FIG. 5 in which W approaches $W_{min}$. This is easily done in a single masking step, since only the width of the devices 10 and 24 will differ, so that no additional masking step is necessary. However, the desired effect of providing two devices having different voltage thresholds, $V_{t\ low}$ and $V_{t\ high}$, is thereby achieved.

Although a single parasitic effect device 24 with the high voltage threshold $V_{t\ high}$ can be used by itself, the usefulness of a single such device 24 is limited to low performance tasks by its narrow width. This is because the current drive capability of a device is proportional to the width W of the device. The current drive capability is defined as the drain current of a device which is on and in the saturation region.

Figure 6:
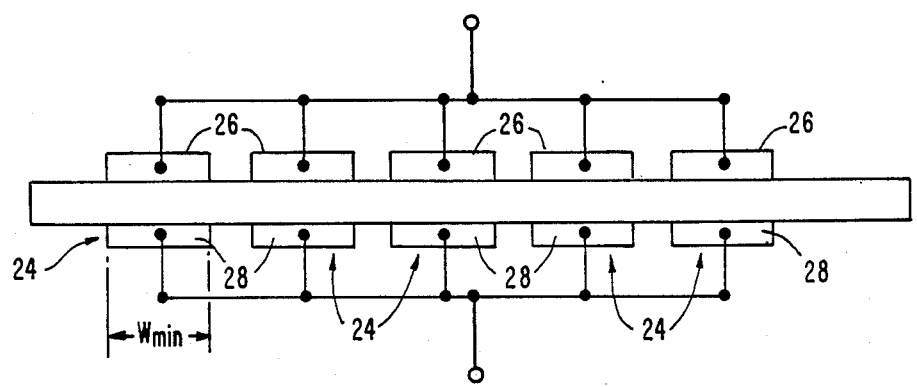
FIG. 6 shows a parallel connection of a plurality of the devices shown in FIG. 5.

In order to increase the usefulness of the devices 24 having the higher threshold voltage $V_{t\ high}$, but narrower width W, an embodiment of the present invention connects a plurality of such devices 24 in parallel. This is shown in FIG. 6, where all of the drains 26 of a number N of devices 24 are connected in parallel. Similarly, the sources 28 of the devices 24 are also connected in parallel. (The sources 28 and drains 26 can be interchanged by simply switching the connections to the unshown circuit.)

The parallel connection of the multiple $W_{min}$ devices 24 effectively provides a single device with a large width W but with a high voltage threshold $V_{t\ high}$. Any effective width (and hence drive capability) for the parallel connected $W_{min}$ devices 24 in FIG. 6 can be obtained by connecting the desired number of devices 24 together. For example, the connected devices 24 of FIG. 6 can be made to have the same effective width W and drive capability as the device of FIG. 1, but with a higher voltage threshold.

Due to the higher voltage threshold, the parallel connected $W_{min}$ devices can be used both for applications which occur at room temperature and cryogenic temperature, whereas the devices on the same chip which have been formed in the same process as the $W_{min}$ devices but which have a lower voltage threshold are suited for use only at lower temperatures. This is because with lower temperatures, the voltage threshold $V_t$ increases, and can increase to the point that the drive capability decreases since the threshold occupies a larger fraction of the signal swing range.

Figure 7:
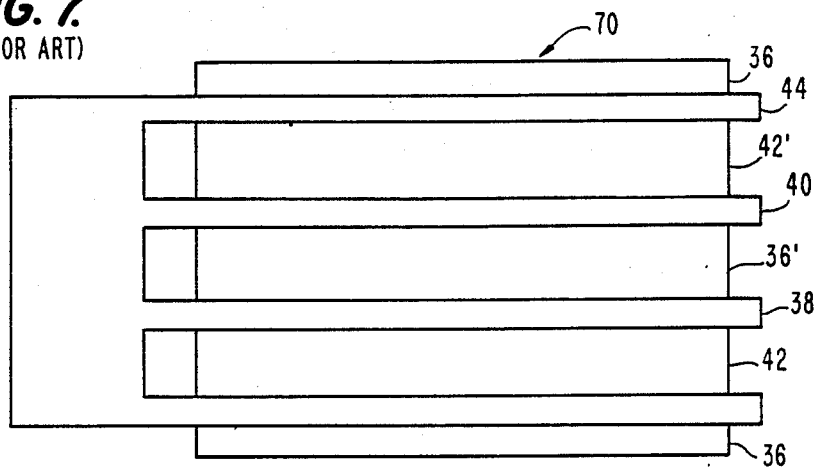
FIG. 7 shows a prior art arrangement for sharing sources and drains.

FIG. 7 shows a prior art arrangement of a large width W and low voltage threshold $V_{t\ low}$ device 70 for use at lower temperature ranges. This arrangement has sources and drains that are shared by two gate strips. For example, source 36' is shared by both gates 38 and 40, while drain 42' is shared by both gates 40 and 44. The fingers of the gates 38, 40 are connected together. This conventional technique of sharing sources and drains leads to greater area efficiency in the layout.

Figure 8:
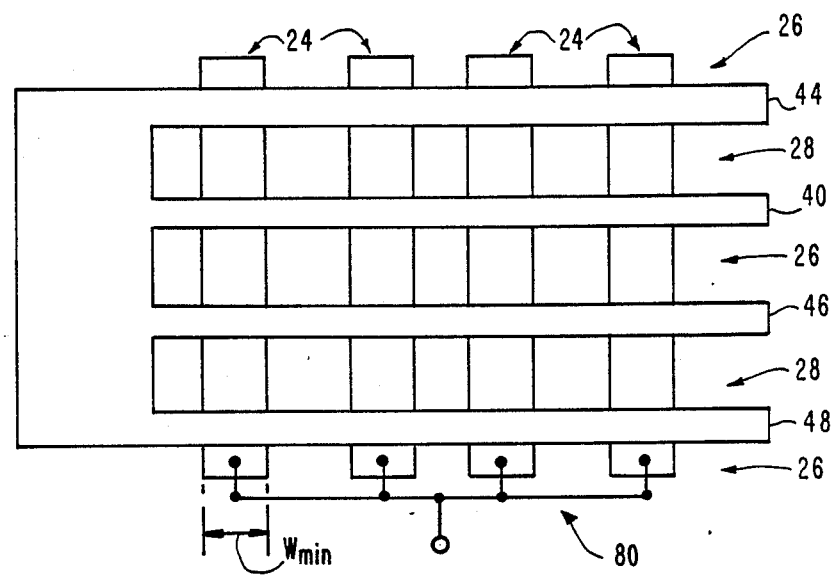
FIG. 8 shows an arrangement for sharing sources and drains for a plurality of the devices shown in FIG. 5.

The concept of sharing sources and drains can be extended to the present invention, as shown in the embodiment of FIG. 8. In this device 80, the gate fingers 40, 44, 46 and 48 extend across a plurality of $W_{min}$ source and drain stripes 26, 28. Again, the same effective width W as the prior art embodiment of FIG. 7 may be achieved, but with the higher voltage threshold $V_{t\ high}$.

Figure 9:
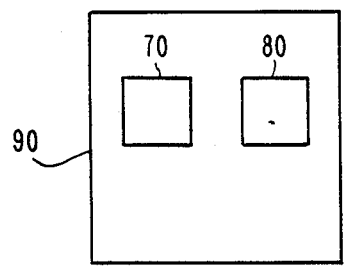
FIG. 9 shows a chip having both the devices of FIG. 7 and FIG. 8.

FIG. 9 shows a single chip 90 having both the devices 70 shown in FIG. 7 and the devices 80 (FIG. 8) of the present invention. The voltage thresholds for both sets of devices 70, 80 are determined in a single masking step.

The devices 80 having a higher voltage threshold $V_{t\ high}$ can be used at both room temperature and cryogenic temperature although their performance at cryogenic temperatures is sub-optimal. Thus, these devices 80 are particularly useful in testing and controlling the functionality of the chip 90 as the chip 90 is lowered from room temperature to cryogenic temperature. However, once at cryogenic temperatures, the devices 70 having a lower voltage threshold $V_{t\ low}$ will perform approximately 1.7 to 2.5 times faster than the devices 80, so that the devices 70 are primarily used for most functions of the chip 90 at cryogenic temperatures.

In summary, the present invention provides an arrangement whereby a chip can be made with at least two different sets of devices having different voltage thresholds, with no additional masking steps being necessary to create the devices with different thresholds. The devices having the higher voltage threshold due to smaller width are connectable so as to yield a device having an effectively larger width but yet retain the high threshold voltages.

What is claimed is:

1. A method of making a semiconductor chip, comprising the steps of:

producing a first set of devices optimized for performance at cryogenic temperatures during a masking step;

simultaneously producing during said masking step a second set of devices optimized for performance at room temperatures and operable at both room temperatures and cryogenic temperatures.

2. A method of making an integrated circuit chip having at least two different sets of MOS field effect transistor devices, each said set having different threshold voltages, each of the devices having gate, source and drain areas, the method comprising:

(a) controlling the width of one of the gate, source and drain areas in a set of first devices with a diffusion mask in a masking step to produce the set of first devices each having a first threshold voltage; and (b) controlling the width of one of the gate, source and drain areas in a set of second devices with the diffusion mask in the same masking step as in step (a) to produce the set of second devices, the set of second devices each having a second threshold voltage different than the first threshold voltage.

3. A method of making an integrated circuit chip having at least two different sets of MOS field effect transistor devices, each said set having different threshold voltages, the method comprising the steps of:

(a) producing a set of first devices each having a first threshold voltage determined in a masking step;

(b) simultaneously producing a set of second devices each having a second threshold voltage determined in the same masking step as in step (a), wherein the first and second threshold voltages are different values; and (c) wherein step (b) includes limiting a width of each of said second devices below a pre-determined width that is narrower than a width of each of said first devices.

4. The method if claim 3 wherein the pre-determined width is approximately three times as large as a transition region in an oxide layer of said second devices.

5. The method of claim 3, wherein the steps of producing said first and second sets of devices includes the step of optimizing said set of first devices to optimally operate at cryogenic temperatures, and optimizing said set of second devices to optimally operate at room temperatures.

6. The method of claim 3, wherein the width of the second devices is limited such that the second threshold voltage is greater than the first threshold voltage due to a parasitic effect.

7. The method of claim 1, further comprising the step of connecting together a plurality of said second devices in parallel.

8. The method of claim 7, further comprising providing at least two gates which share at least one of a source and a drain of said second devices.

* * * * *